(12) United States Patent
Lee et al.

(10) Patent No.: US 12,550,377 B2
(45) Date of Patent: Feb. 10, 2026

(54) OXIDE SEMICONDUCTOR TRANSISTOR

(71) Applicant: Samsung Electronics Co., Ltd., Suwon-si (KR)

(72) Inventors: Kwanghee Lee, Hwaseong-si (KR); Sangwook Kim, Seongnam-si (KR); Euntae Kim, Osan-si (KR); Jeeeun Yang, Uiwang-si (KR); Moonil Jung, Suwon-si (KR); Sangjun Hong, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 523 days.

(21) Appl. No.: 17/540,662

(22) Filed: Dec. 2, 2021

(65) Prior Publication Data
US 2023/0051857 A1 Feb. 16, 2023

(30) Foreign Application Priority Data
Aug. 12, 2021 (KR) .................. 10-2021-0106946

(51) Int. Cl.
*H10D 30/67* (2025.01)

(52) U.S. Cl.
CPC ..... *H10D 30/6755* (2025.01); *H10D 30/6713* (2025.01); *H10D 30/6729* (2025.01); *H10D 30/6734* (2025.01); *H10D 30/6757* (2025.01)

(58) Field of Classification Search
None
See application file for complete search history.

(56) References Cited

U.S. PATENT DOCUMENTS

| | | | |
|---|---|---|---|
| 9,847,428 B1 * | 12/2017 | Zhou ............... | H10D 30/6729 |
| 10,243,083 B2 | 3/2019 | Uchida et al. | |
| 10,297,694 B2 | 5/2019 | Ito | |
| 2014/0131700 A1 * | 5/2014 | Yamazaki ......... | H01L 27/1214 257/43 |
| 2015/0280013 A1 * | 10/2015 | Yamazaki ......... | H10D 30/6734 257/43 |
| 2019/0386035 A1 | 12/2019 | Li | |
| 2020/0020756 A1 | 1/2020 | Ueda et al. | |
| 2020/0203535 A1 | 6/2020 | Choi et al. | |
| 2020/0235213 A1 | 7/2020 | Gelinck et al. | |
| 2020/0411692 A1 | 12/2020 | Dewey et al. | |
| 2021/0036146 A1 * | 2/2021 | Zhou ............... | H01L 29/0638 |
| 2022/0199620 A1 * | 6/2022 | Thomas ........... | H01L 21/823807 |
| 2022/0416034 A1 * | 12/2022 | Sharma ........... | H01L 21/823475 |

* cited by examiner

*Primary Examiner* — Sarah K Salerno
(74) *Attorney, Agent, or Firm* — Harness, Dickey & Pierce, P.L.C.

(57) ABSTRACT

Provided are oxide semiconductor transistors. The oxide semiconductor transistor includes a substrate, a channel layer arranged on the substrate and having a flat plate shape extending along one plane, a gate electrode facing a part of the channel layer, and a source region and a drain region separated from each other with the gate electrode therebetween, wherein the source region contacts three or more surfaces of the channel layer, and the drain region contacts three or more surfaces of the channel layer.

23 Claims, 11 Drawing Sheets

OXIDE SEMICONDUCTOR TRANSISTOR

CROSS-REFERENCE TO RELATED APPLICATION

This application is based on and claims priority under 35 U.S.C. § 119 to Korean Patent Application No. 10-2021-0106946, filed on Aug. 12, 2021, in the Korean Intellectual Property Office, the disclosure of which is incorporated by reference herein in its entirety.

BACKGROUND

Some example embodiments relate to oxide semiconductor transistors.

Oxide semiconductor devices have been studied for many years for use as a transparent semiconductor material having a wide bandgap of 3.0 eV or more. An oxide semiconductor device is mass-produced as a driving device for a large-area organic light-emitting diode televisions (OLED TV).

As the degree of integration of a semiconductor device increases, the size of the semiconductor device is required/desired to be small. In the case of an oxide semiconductor transistor, as the size thereof decreases, a channel length may decrease. As the channel length of the oxide semiconductor transistor decreases, the reduction of an off-current becomes important. Alternatively or additionally, the improvement of a subthreshold swing (SS) and an on/off ratio may also be important as characteristics for clearly distinguishing an on/off state.

Alternatively or additionally, as a channel length of an oxide semiconductor transistor decreases, a contact area between a channel and source electrode/drain electrodes may be decreased, and thus, a contact resistance between the channel and source electrode/drain electrodes may be increased. Accordingly, a short channel effect in which the charge mobility of the oxide semiconductor transistor is reduced and a threshold voltage is shifted may occur.

SUMMARY

Provided are oxide semiconductor transistors having improved electrical characteristics.

However, example embodiments are not limited to the above disclosure.

Additional aspects will be set forth in part in the description which follows and, in part, will be apparent from the description, or may be learned by practice of the presented embodiments of the disclosure.

According to some example embodiments, an oxide semiconductor transistor includes a substrate, a channel layer on the substrate and having a flat plate shape extending along one plane, a gate electrode facing a part of the channel layer; and a source region and a drain region that are separated from each other with the gate electrode between the source region and the drain region. The source region contacts at least three surfaces of the channel layer, and the drain region contacts at least three surfaces of the channel layer.

The source region may contact an upper surface of, a lower surface of, and one side surface of the channel layer, and the drain region may contact the upper surface of, the lower surface of, and another side surface of the channel layer.

The source region may contact the upper surface of, the lower surface of, a front surface of, and a rear surface of the channel layer, and the drain region may contact with the upper surface of, the lower surface of, the front surface of, and the rear surface of the channel layer.

The source region may be in further contact with the front and rear surfaces of the channel layer, and the drain region may be in further contact with the front and rear surfaces of the channel layer.

The oxide semiconductor transistor may further include a first buffer layer between the channel layer and the source region and a second buffer layer between the channel layer and the drain region.

The substrate may include an insulating substrate, and the source region and the drain region may contact the substrate.

The substrate may include a conductive substrate, and the source region and the drain region may be separated from the substrate.

The oxide semiconductor transistor may further include an interlayer insulating layer between the substrate and the source region and the drain region.

The gate electrode may be on a second surface of the channel layer opposite to the first surface of the channel layer facing the substrate.

The gate electrode may be between the channel layer and the substrate.

The gate electrode may include a first gate electrode, and the gate electrode may further include a second gate electrode symmetrically arranged with the first gate electrode with the channel layer therebetween.

The oxide semiconductor transistor may further include a gate spacer covering a side surface of the gate electrode.

The channel layer may have a thickness of 30 nm or less.

The channel layer may include an oxide semiconductor layer.

The oxide semiconductor transistor may further include a gate insulating layer between the channel layer and the gate electrode.

The source region may include a first contact unit contacting with the channel layer, and a first conductive plug contacting the first contact unit and extending in one direction, and the drain region may include a second contact unit contacting with the channel layer, and a second conductive plug contacting the second contact unit and extending in the one direction. The source region may further include a source electrode contacting the first conductive plug and the drain region may further include a drain electrode contacting the second conductive plug.

The first conductive plug and the second conductive plug may extend in a direction perpendicular to a second surface of the channel layer opposite to the first surface of the channel layer facing the substrate.

The first conductive plug and the second conductive plug may be between the channel layer and the substrate.

The first conductive plug and the second conductive plug may extend in one direction parallel to the extending direction of the channel layer.

The gate electrode may include a first gate electrode, and may further include a second gate electrode symmetrically arranged with the first gate electrode with the channel layer between the first gate electrode and the second gate electrode.

The channel layer may extend in one direction perpendicular to an upper surface of the substrate, and the first conductive plug and the second conductive plug may extend in one direction parallel to the extending direction of the channel layer.

The gate electrode may include a first gate electrode, and the gate electrode may further include a second gate electrode symmetrically arranged with the first gate electrode with the channel layer therebetween.

According to some example embodiments, a memory apparatus comprising a plurality of memory cells. Each memory cell may include a switching device and a data storage element connected to the switching device. The switching device may include a channel layer and a gate electrode facing a part of the channel layer and a source region and a drain region that are separated from each other with the gate electrode therebetween. The source region contacts at least three surfaces of the channel layer, and the drain region contacts at least three surfaces of the channel layer.

The source region may contact an upper surface of, a lower surface of, and one side surface of the channel layer, and the drain region may contact the upper surface of, the lower surface of, and another side surface of the channel layer.

The source region may contact the upper surface of, the lower surface of, a front surface of, and a rear surface of the channel layer of, and the drain region may contact the upper surface of, the lower surface of, the front surface of, and the rear surface of the channel layer.

The source region may further contact the front and rear surfaces of the channel layer, and the drain region may further contact the front and rear surfaces of the channel layer.

According to some example embodiments, an oxide semiconductor transistor may include a substrate, a channel layer on the substrate and having a flat plate shape extending along one plane, a gate electrode facing a part of the channel layer; and a source region and a drain region that are separated from each other with the gate electrode between the source region and the drain region. The source region contacts an upper surface of, a side surface of, and a lower surface of the channel layer.

A thickness of a portion of the source region that contacts the upper surface of the channel layer may be different from a thickness of a portion of the source region that contacts the lower surface of the channel layer.

The upper surface of the channel layer may intersect the side surface of the channel layer at a right angle.

A thickness of a portion of the source region that contacts the upper surface of the channel layer may be different from a thickness of a portion of the source region that contacts the side surface of the channel layer.

According to some example embodiments, an organic light emitting diode television (OLED TV) may include a screen. The screen may include an array of light emitting diodes. The light emitting diodes may be driven by the oxide semiconductor transistor.

BRIEF DESCRIPTION OF THE DRAWINGS

The above and other aspects, features, and advantages of some example embodiments will be more apparent from the following description taken in conjunction with the accompanying drawings, in which.

DETAILED DESCRIPTION OF EXAMPLE EMBODIMENTS

Figure 1:
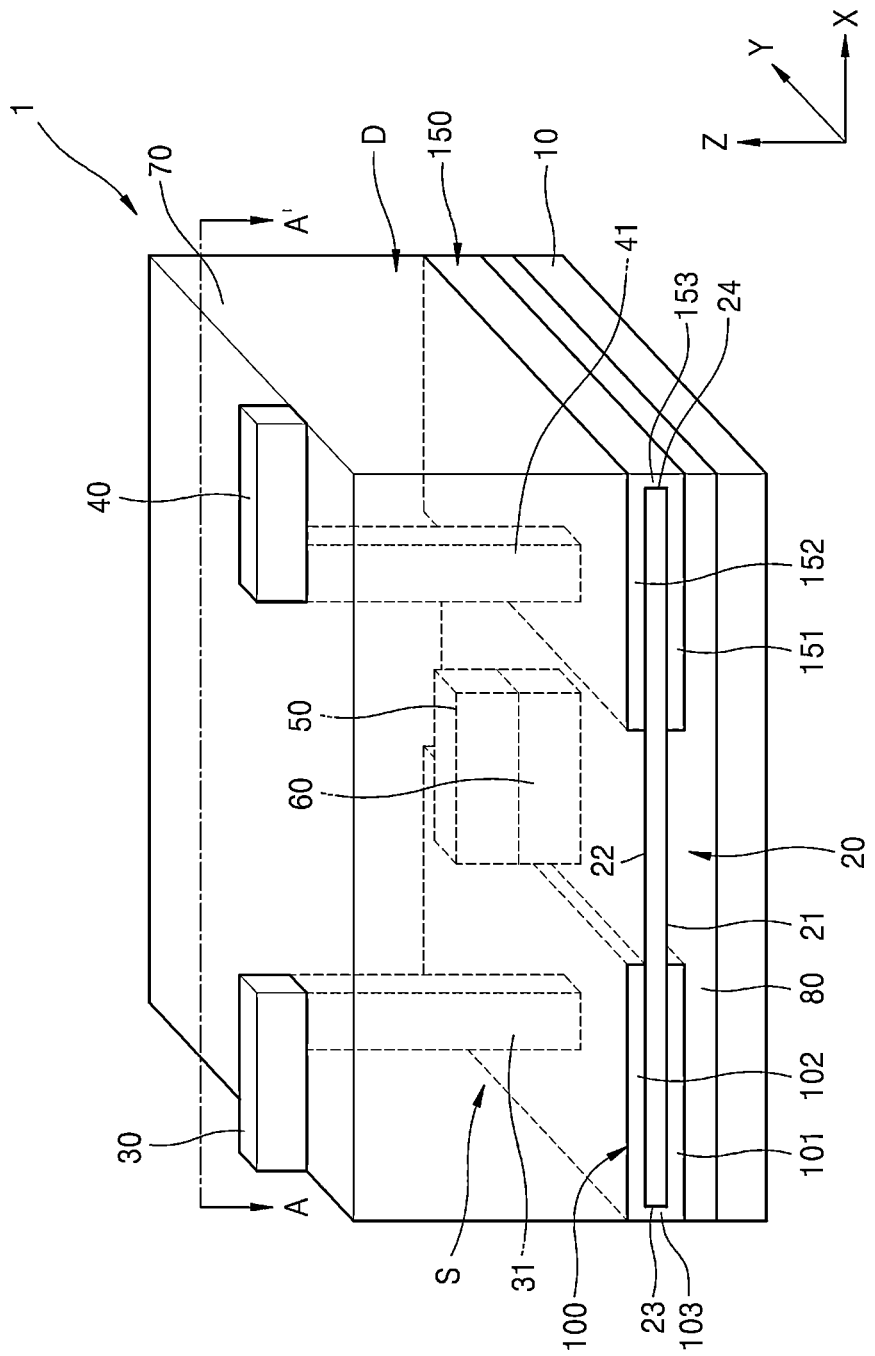
FIG. 1 is a perspective view of an oxide semiconductor transistor according to some example embodiments.

Reference will now be made in detail to various example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the inventive concept will be described in detail with reference to the accompanying drawings. In the following drawings, like reference numerals refer to like constituent elements, and the size of each component in the drawings may be exaggerated for clarity and convenience of description. Some example embodiments are capable of various modifications and may be embodied in many different forms.

Hereinafter, when an element or layer is referred to as being "on" or "above" another element or layer, the element or layer may be directly on another element or layer or intervening elements or layers.

Singular expressions include plural expressions unless the context clearly dictates otherwise. Also, it should be understood that, when a part "comprises" or "includes" an element in the specification, unless otherwise defined, it is not excluding other elements but may further include other elements.

FIG. 1 is a perspective view of an oxide semiconductor transistor 1 according to some example embodiments. FIG.

2A is a cross-sectional view taken along line A-A' of FIG. 1. FIG. 2B is a cross-sectional view of an oxide semiconductor transistor according to some example embodiments.

Figure 2A:
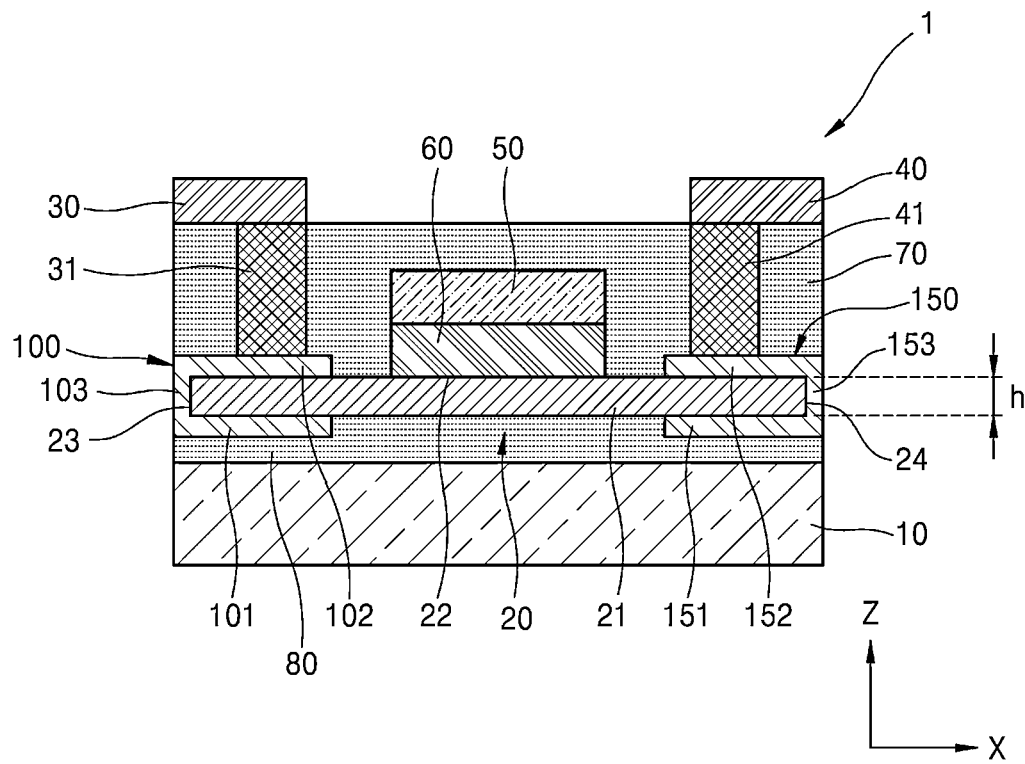
FIG. 2A is a cross-sectional view taken along line A-A' of FIG. 1.
Figure 2B:
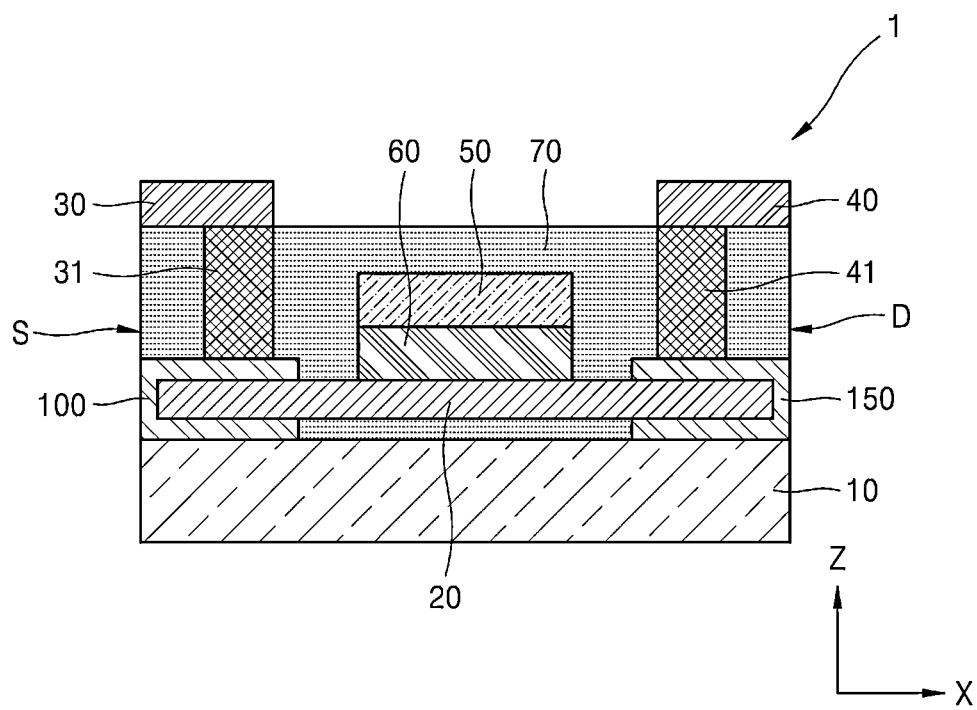
FIG. 2B is a cross-sectional view of an oxide semiconductor transistor according to some example embodiments.

Referring to FIGS. 1 and 2A, the oxide semiconductor transistor 1 according to some example embodiments may include a substrate 10, a channel layer 20 on the substrate 10, a source electrode 30, a drain electrode 40, a gate electrode 50 arranged to face a part of the channel layer 20, and a source region S that is electrically connected to the source electrode 30 and in contact with three or more surfaces of the channel layer 20, a drain region D that is electrically connected to the drain electrode 40 and in contact with three or more surfaces of the channel layer 20, and an interlayer insulating layer 70.

The substrate 10 may be provided in a flat plate shape extending along one plane. As an example, the substrate 10 may be a conductive substrate or may include a conductive substrate. The source region S and the drain region D may be arranged to be separated from the substrate 10. An intermediate insulating layer 80, which will be described later, may be arranged between the substrate 10 and the source region S and the drain region D. Accordingly, no current or a reduced amount of current flows between the source region S and the drain region D. According to some example embodiments, the intermediate insulating layer 80 may be connected to an interlayer insulating layer 70 to be described later. The intermediate insulating layer 80 may be a part of the interlayer insulating layer 70. Alternatively, the intermediate insulating layer 80 and the interlayer insulating layer 70 may be a single unit connected to each other.

However, example embodiments are not limited thereto, and the substrate 10 according to some example embodiments may include an electrically insulating material. For example, the substrate 10 may include one or more of silicon oxide, aluminum oxide, or nitride. In this case, as shown in FIG. 2B, the substrate 10 may be connected to the source region S and the drain region D, which will be described later. In this case, the region of the substrate 10 in contact with the source region S and the drain region D may include an insulating material. Accordingly, no current or a reduced current flows between the source region S and the drain region D.

The channel layer 20 is arranged on the substrate 10 and may be provided in a flat plate shape extending along one plane. As an example, the channel layer 20 may be provided in the form of an ultra-thin film. For example, the channel layer 20 may have a thickness h of 30 nm or less. The channel layer 20 according to some example embodiments may include an oxide semiconductor layer including an oxide semiconductor material. For example, the channel layer 20 may include an oxide of a material selected from Group 12, 13, and 14 metal elements, such as zinc (Zn), indium (In), gallium (Ga), tin (Sn), cadmium (Cd), germanium (Ge), or hafnium (Hf) or a combination thereof. For example, the channel layer may include a Zn oxide-based material, such as Zn oxide, In—Zn oxide, Ga—In—Zn oxide, or the like. For example, the channel layer 20 may include an In—Ga—Zn—O (IGZO) semiconductor in which metals, such as indium (In) and gallium (Ga) are included in ZnO. As an example, the channel layer 20 may be provided in a single-layer or multi-layer structure.

The source electrode 30 may be arranged on the source region S to be electrically connected to the source region S. As an example, the source electrode 30 may include an electrically conductive material. For example, the source electrode 30 may include a metal and/or a metal compound.

The drain electrode 40 may be arranged on the drain region D to be electrically connected to the drain region D. As an example, the drain electrode 40 may include an electrically conductive material. For example, the drain electrode 40 may include a metal and/or a metal compound, and may include the same or different materials than the source electrode 30.

The gate electrode 50 may be arranged to face a part of the channel layer 20. For example, the gate electrode 50 may be arranged on an upper surface 22 of the channel layer 20 opposite to a lower surface 21 of the channel layer 20 facing the substrate 10. According to some example embodiments, the gate electrode 50 may include an electrically conductive material. For example, the gate electrode 50 may include a metal and/or a metal compound, and may include the same or different materials than either or both of the source electrode 30 or the drain electrode 40. As an example, the gate electrode 50 may be arranged to be separated from the channel layer 20 in a third direction (a Z-direction). In this case, a gate insulating layer 60 may be arranged between the channel layer 20 and the gate electrode 50 to electrically disconnect the channel layer 20 from the gate electrode 50. For example, the gate insulating layer 60 may include a ferroelectric material. As an example, the ferroelectric material may include at least one of a fluoride ferroelectric material, such as an oxide ferroelectric material, a polymer ferroelectric material, or $BaMgF_4$ (BMF), and/or a ferroelectric material semiconductor. Alternatively or additionally, the gate insulating layer 60 may have a width the same as or different from that of the gate electrode 50. For example, the width of the gate insulating layer 60 may be the same as that of the gate electrode 50, or may be greater or less than that of the gate electrode 50.

The source region S is electrically connected to the source electrode 30 and may be arranged to contact three or more surfaces of the channel layer 20. As an example, the source region S includes a first contact unit 100 in contact with the channel layer 20 and a first conductive plug 31 in contact with the first contact unit 100 and extending in one direction. The first conductive plug 31 may extend in one direction and may be arranged between the source electrode 30 and the first contact unit 100. For example, the first conductive plug 31 may extend in the third direction perpendicular to the upper surface 22 of the channel layer 20 opposite to the lower surface 21 of the channel layer 20 facing the substrate 10. At this point, both ends of the first conductive plug 31 may respectively contact the source electrode 30 and the first contact unit 100. Accordingly, the first conductive plug 31 may electrically connect the source electrode 30 and the first contact unit 100. As an example, the first conductive plug 31 may include an electrically conductive material. For example, the first conductive plug 31 may include a metal and/or a metal compound. According to some example embodiments, the source electrode 30 and the first conductive plug 31 may be integrally formed; e.g. there may or may not be an interface between the source electrode 30 and the first conductive plug 31.

The first contact unit 100 is arranged between the channel layer 20 and the first conductive plug 31, and may contact the channel layer 20 on three or more surfaces. As described above, as or when the thickness h of the channel layer 20 decreases to an ultra-thin film, the thickness of an effective channel formed by a gate field may be substantially the same as the thickness of the physical channel layer 20. A difference in charge concentration between the lower surface 21 and the upper surface 22 of the channel layer 20 may also be reduced, thus, a total area of the channel layer 20 may be a contact area in which the channel layer 20 contacts the source region S and the drain region D.

As an example, when the channel layer 20 is provided in the form of a thin film extending along one plane, the first contact unit 100 may include a first lower contact layer 101 surrounding a portion of the lower surface 21 of the channel layer 20, a first upper contact layer 102 surrounding a portion of the upper surface 22 of the channel layer 20, and a first side contact layer 103 surrounding one side 23 of the channel layer 20. As described herein, it is defined that the lower surface 21 of the channel layer 20 is an XY plane facing the substrate 10, the upper surface 22 of the channel layer 20 is an XY plane facing the lower surface 21, the one side 23 of the channel layer 20 is a YZ plane arranged between the lower surface 21 and the upper surface 22, the other side 24 of the channel layer 20 is a YZ plane facing the one side 23, a front surface 25 (refer to FIG. 3B) of the channel layer 20 is an XZ plane arranged between the one side 23 and the other side 24, and a rear surface 26 (refer to FIG. 3B) of the channel layer 20 is an XZ plane facing the front surface 25. However, the shape of the channel layer 20 is not limited to the shape described above, and the first contact unit 100 may be arranged between the first conductive plugs 31 and the channel layer 20 regardless of the shape of the channel layer 20, and may contact the channel layer 20 on three or more surfaces.

The first lower contact layer 101 may be arranged to face the substrate 10. The first upper contact layer 102 may be arranged to face the first lower contact layer 101 with the channel layer 20 therebetween. As an example, the first upper contact layer 102 may be provided to contact one end of the first conductive plug 31. The first side contact layer 103 may be arranged between the first lower contact layer 101 and the first upper contact layer 102 to connect the first lower contact layer 101 and the first upper contact layer 102.

As an example, the first contact unit 100 may include an electrically conductive material. For example, the first contact unit 100 may include a metal and/or a metal compound. According to some example embodiments, the source electrode 30, the first conductive plug 31, and the first contact unit 100 may be integrally formed; e.g. there may or may not be an interface between the source electrode 30 and the first conductive plug 31 and/or between the first contact unit 100 and the first conductive plug 31. At this point, the source electrode 30, the first conductive plug 31, and the first contact unit 100 may collectively be referred to as a source electrode.

The drain region D is electrically connected to the drain electrode 40 and may be arranged to contact three or more surfaces of the channel layer 20. As an example, the source region S and the drain region D may be arranged to be separated from each other in a first direction X with the gate electrode 50 therebetween. As an example, the drain region D may include a second contact unit 150 in contact with the channel layer 20 and a second conductive plug 41 in contact with the second contact unit 150 and extending in one direction. The second conductive plug 41 may extend in one direction and may be arranged between the drain electrode 40 and the second contact unit 150. For example, the second conductive plug 41 may extend along the third direction Z perpendicular to the upper surface 22 of the channel layer 20. At this point, both ends of the second conductive plug 41 may respectively contact the drain electrode 40 and the second contact unit 150. Accordingly, the second conductive plug 41 may electrically connect the drain electrode 40 and the second contact unit 150. As an example, the second conductive plug 41 may include an electrically conductive material. For example, the second conductive plug 41 may include a metal and/or a metal compound. According to some example embodiments, the drain electrode 40 and the second conductive plug 41 may be integrally formed; e.g. there may or may not be an interface between the drain electrode 40 and the second conductive plug 41.

The second contact unit 150 may be arranged between the channel layer 20 and the second conductive plug 41, and may contact the channel layer 20 on three or more surfaces in the same manner as the first contact unit 100. As an example, when the channel layer 20 is provided in the form of a thin film extending along one plane, the second contact unit 150 may include a second lower contact layer 151 surrounding a portion of the lower surface of the channel layer 20, a second upper contact layer 152 surrounding a portion of the upper surface of the channel layer 20, and a second side contact layer 153 surrounding one side of the channel layer 20. The second lower contact layer 151 may be arranged to face the substrate 10. The second upper contact layer 152 may be arranged to face the second lower contact layer 151 with the channel layer 20 therebetween. As an example, the second upper contact layer 152 may be provided to contact one end of the second conductive plug 41. The second side contact layer 153 may be arranged between the second lower contact layer 151 and the second upper contact layer 152 to connect the second lower contact layer 151 and the second upper contact layer 152.

A thickness of each of the second lower contact layer 151, the second upper contact layer 152, and the second side contact layer 153 may be the same. Alternatively, at least one of the second lower contact layer 151, the second upper contact layer 152, and the second side contact layer 153 may have a thickness that is different than at least one other of the second lower contact layer 151, the second upper contact layer 152, and the second side contact layer 153. Additionally or alternatively, the one side 23 of the channel layer 20 may meet either or both of the lower surface 21 of the channel layer 20 and the upper surface 22 of the channel layer 20 in an angle, such as a right angle or an angle other than a right angle. Additionally or alternatively, the one side 23 of the channel layer 20 may meet either or both of the lower surface 21 of the channel layer 20 and the upper surface 22 of the channel layer 20 with a beveled profile.

As an example, the second contact unit 150 may include an electrically conductive material. For example, the second contact unit 150 may include a metal and/or a metal compound that may or may not be the same as the first contact unit 100. According to some example embodiments, the drain electrode 40, the second conductive plug 41, and the second contact unit 150 may be integrally formed; e.g. there may or may not be an interface between the drain electrode 40 and the second conductive plug 41 and/or between the second conductive plug 41 and the second contact unit 150. In this case, the drain electrode 40, the second conductive plug 41, and the second contact unit 150 may be collectively referred to as a drain electrode.

The interlayer insulating layer 70 is arranged between the channel layer 20, the gate electrode 50, the source region S, and the drain region D, and may electrically disconnect the channel layer 20, the gate electrode 50, the source region S, and the drain region D from each other. As an example, the first conductive plug 31 and the second conductive plug 41 included in the source region S and the drain region D are surrounded by the interlayer insulating layer 70, and the channel layer 20 and the gate electrode 50 may be arranged to be buried by the interlayer insulating layer 70.

Figure 3A:
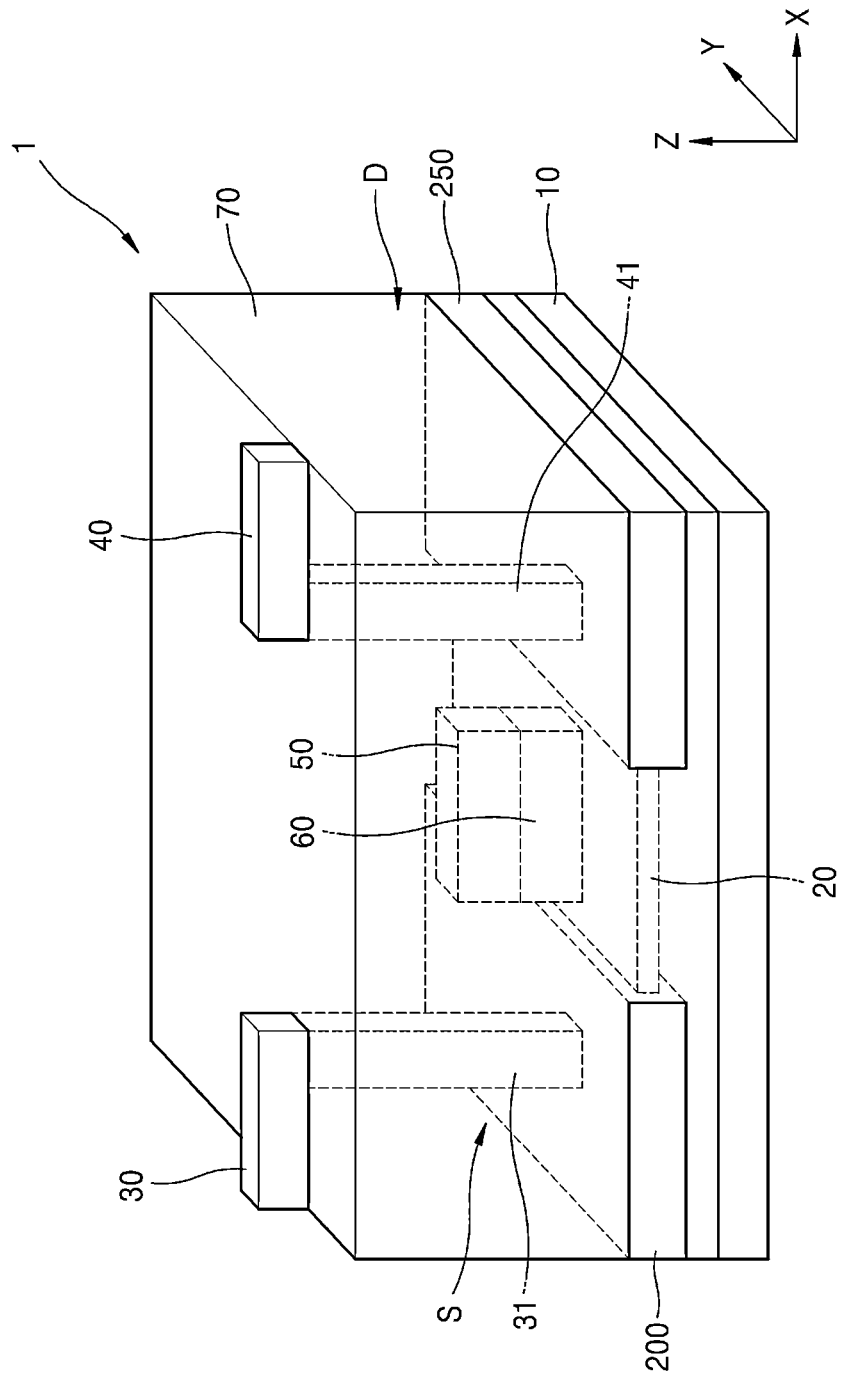
FIG. 3A is a perspective view of an oxide semiconductor transistor according to some example embodiments.
Figure 3B:
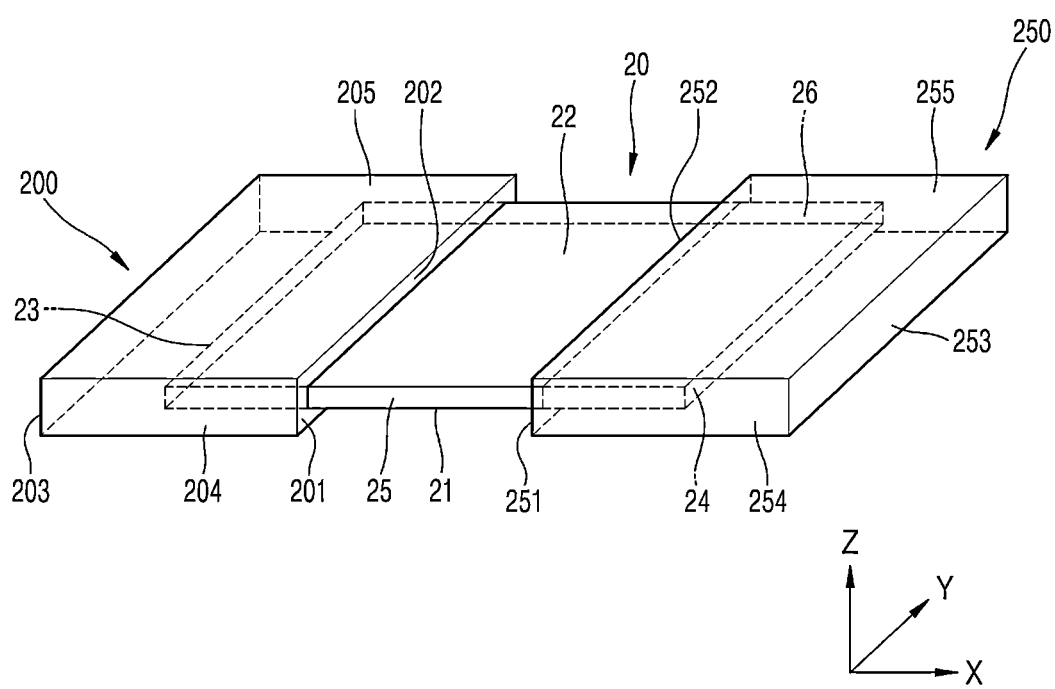
FIG. 3B is a perspective view of a channel layer and first and second contact units shown in FIG. 3A.

FIG. 3A is a perspective view of an oxide semiconductor transistor 1 according to some example embodiments. FIG. 3B is a perspective view of a channel layer 20 and the first and second contact units 200 and 250 shown in FIG. 3A.

Referring to FIGS. 3A and 3B, the oxide semiconductor transistor 1 according to some example embodiments may include: a substrate 10; a channel layer 20 on the substrate 10; a source electrode 30; a drain electrode 40; a gate electrode 50 arranged to face a part of the channel layer 20; a source region S including a first contact unit 200 electrically connected to the source electrode 30 and in contact with the channel layer 20 and a first conductive plug 31 in contact with the first contact unit 200 and extending in one direction; a drain region D including a second contact unit 250 electrically connected to the drain electrode 40 and in contact with the channel layer 20 and a second conductive plug 41 in contact with the second contact unit 250 and extending in one direction; and an interlayer insulating layer 70. Configurations other than the first contact unit 200 and the second contact unit 250 are substantially the same as the configurations shown in FIGS. 1 and 2A, and thus, descriptions thereof will be omitted for convenience of explanation.

The first contact unit 200 is arranged between the channel layer 20 and the first conductive plug 31, and may contact the channel layer 20 on three or more surfaces, for example, on five surfaces. As an example, when the channel layer 20 is provided in a thin film shape extending along one plane, the first contact unit 200 may include a first lower contact layer 201 surrounding a portion of a lower surface 21 of the channel layer 20, a first upper contact layer 202 surrounding a portion of an upper surface 22 of the channel layer 20, a first side contact layer 203 surrounding one side 23 of the channel layer 20, a first front contact layer 204 surrounding a portion of a front surface 25 of the channel layer 20, and a first rear contact layer 205 surrounding a rear surface 26 of the channel layer 20.

The first lower contact layer 201 may be arranged to face the substrate 10. The first upper contact layer 202 may be arranged to face the first lower contact layer 201 with the channel layer 20 therebetween. As an example, the first upper contact layer 202 may be provided to contact one end of the first conductive plug 31. The first side contact layer 203, the first front contact layer 204, and the first back contact layer 205 are arranged between the first bottom contact layer 201 and the first top contact layer 202 to connect the first lower contact layer 201 and the first upper contact layer 202.

As an example, the first contact unit 200 may include an electrically conductive material. For example, the first contact unit 200 may include a metal or a metal compound. According to some example embodiments, the source electrode 30, the first conductive plug 31, and the first contact unit 200 may be integrally formed. In this case, the source electrode 30, the first conductive plug 31, and the first contact part 200 may be collectively referred to as a source electrode.

The second contact unit 250 is arranged between the channel layer 20 and the second conductive plug 41, and may contact the channel layer 20 on three or more surfaces, for example, on five surfaces. As an example, when the channel layer 20 is provided in a thin film shape extending along one plane, the second contact part 250 may include a second lower contact layer 251 surrounding a portion of the lower surface 21 of the channel layer 20, a second upper contact layer 252 surrounding a portion of the upper surface 22 of the channel layer 20, a second side contact layer 253 surrounding the other side 24 of the channel layer 20, a second front contact layer 254 surrounding a portion of the front surface 25 of the channel layer 20, and a second rear contact layer 255 surrounding the rear surface 26 of the channel layer 20.

The second lower contact layer 251 may be arranged to face the substrate 10. The second upper contact layer 252 may be arranged to face the second lower contact layer 251 with the channel layer 20 therebetween. As an example, the second upper contact layer 252 may be provided to contact one end of the second conductive plug 41. The second side contact layer 253, the second front contact layer 254, and the second rear contact layer 255 are arranged between the second lower contact layer 251 and the second upper contact layer 252 to connect the lower contact layer 251 and the second upper contact layer 252.

As an example, the second contact unit 250 may include an electrically conductive material. For example, the second contact unit 250 may include a metal or a metal compound. According to an example, the drain electrode 40, the second conductive plug 41, and the second contact unit 250 may be integrally formed. In this case, the drain electrode 40, the second conductive plug 41, and the second contact part 250 may be collectively referred to as a drain electrode.

Figure 4A:
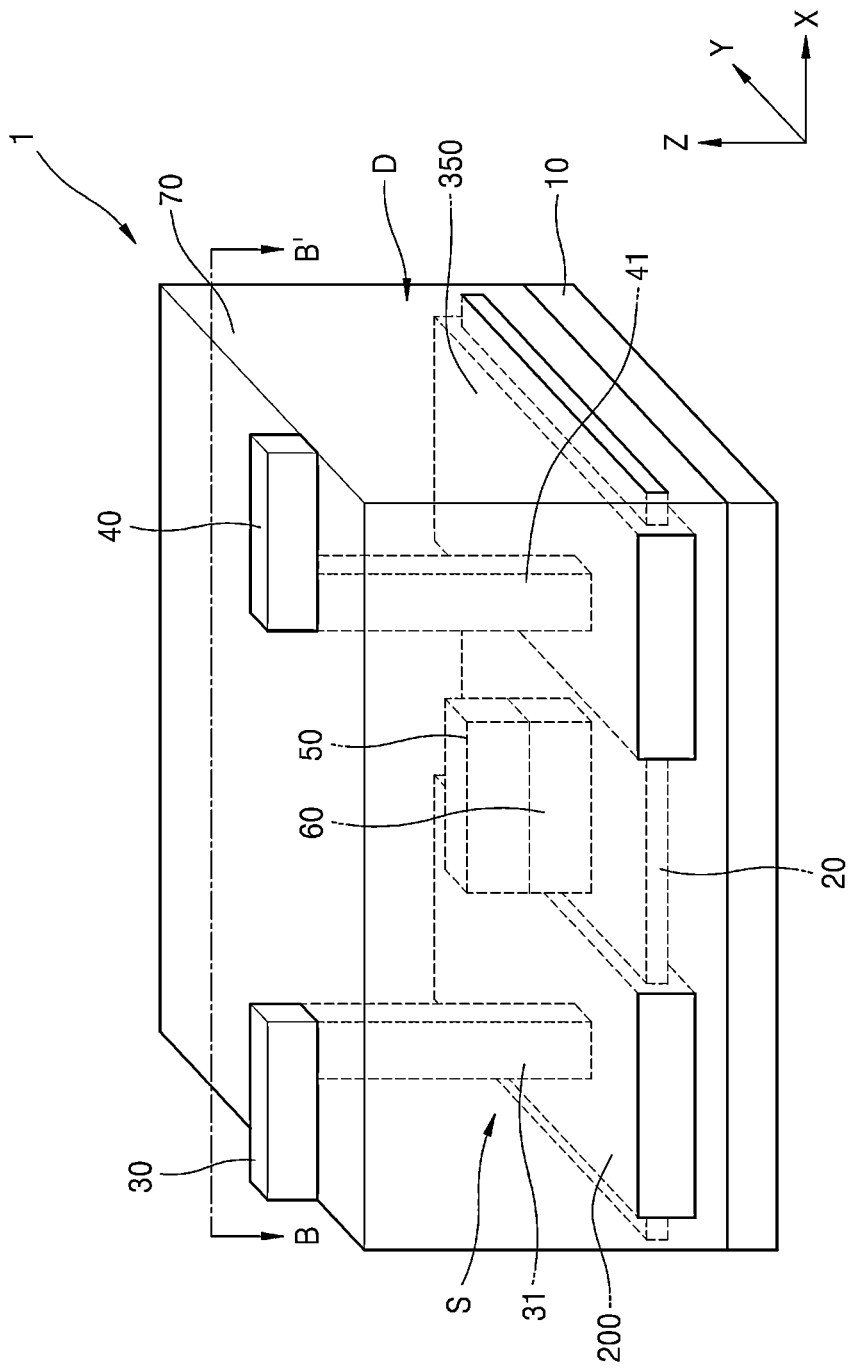
FIG. 4A is a perspective view of an oxide semiconductor transistor according to some example embodiments.
Figure 4B:
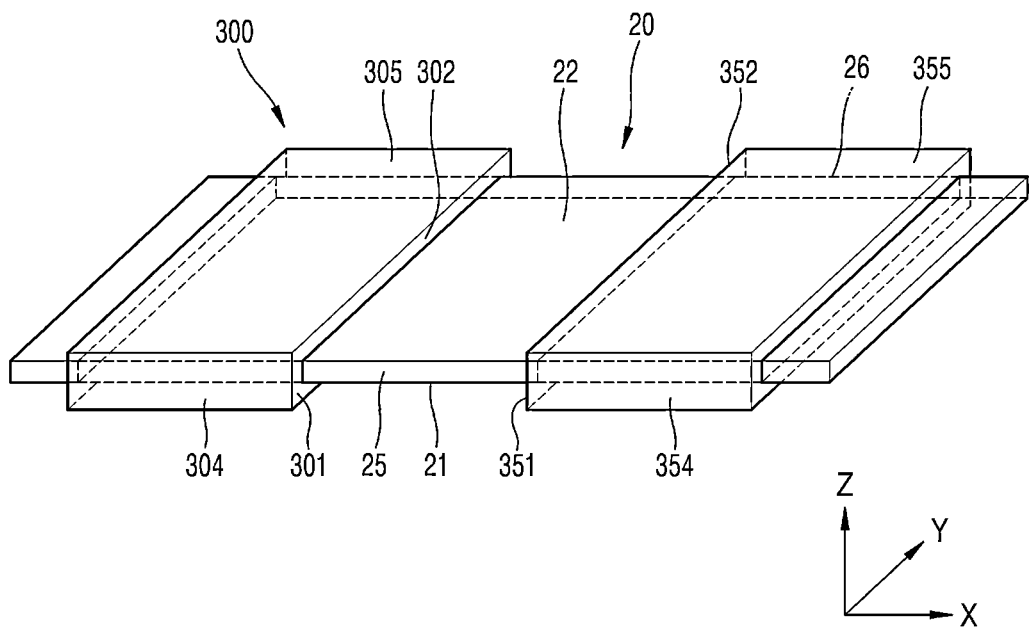
FIG. 4B is a cross-sectional view taken along line B-B' of FIG. 4A.
Figure 4C:
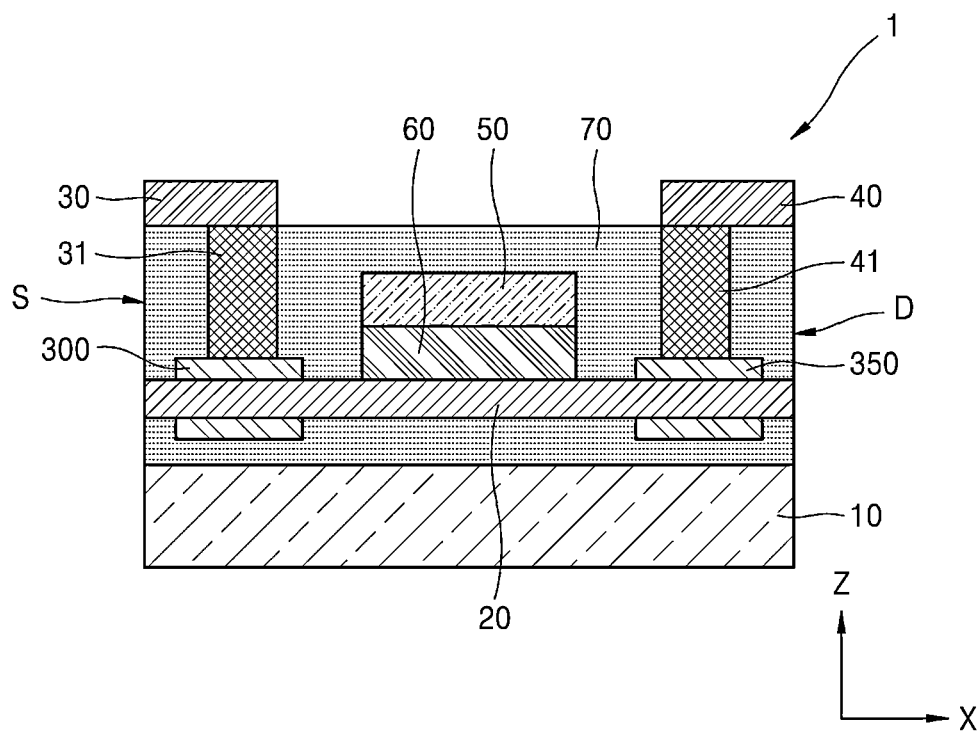
FIG. 4C is a perspective view of a channel layer and first and second contact units shown in FIG. 4A.

FIG. 4A is a perspective view of an oxide semiconductor transistor 1 according to some example embodiments. FIG. 4B is a perspective view of a channel layer 20 and first and second contact units 300 and 350 shown in FIG. 4A. FIG. 4C is a cross-sectional view taken along line B-B' of FIG. 4A.

Referring to FIGS. 4A to 4C, the oxide semiconductor transistor 1 according to some example embodiments may include: a substrate 10; a channel layer 20 on the substrate 10; a source electrode 30; a drain electrode 40; a gate electrode 50 arranged to face a part of the channel layer 20; a source region S including a first contact unit 300 electrically connected to the source electrode 30 and in contact with the channel layer 20 and a first conductive plug 31 in contact with the first contact unit 300 and extending in one direction; a drain region D including a second contact unit 350 electrically connected to the drain electrode 40 and in contact with the channel layer 20 and a second conductive plug 41 in contact with the second contact unit 350 and extending in one direction; and an interlayer insulating layer 70. Configurations other than the first contact unit 300 and the second contact unit 350 are substantially the same as those shown in FIGS. 1 and 2A, and thus, descriptions thereof will be omitted for convenience of explanation.

The first contact unit 300 is arranged between the channel layer 20 and the first conductive plug 31, and may contact the channel layer 20 on three or more surfaces, for example, on four surfaces. As an example, when the channel layer 20 is provided in a thin film shape extending along one plane, the first contact unit 300 may include a first lower contact layer 301 surrounding a portion of the lower surface 21 of the channel layer 20, a first upper contact layer 302 surrounding a portion of the upper surface 22 of the channel layer 20, a first front contact layer surrounding a portion of the front surface 25 of the channel layer 20, and a first rear contact layer 305 surrounding the rear side 26 of the channel layer 20.

The first lower contact layer 301 may be arranged to face the substrate 10. The first upper contact layer 302 may be arranged to face the first lower contact layer 301 with the channel layer 20 therebetween. As an example, the first upper contact layer 302 may be provided to contact one end of the first conductive plug 31. The first front contact layer 304 and the first rear contact layer 305 are arranged between the first lower contact layer 301 and the first upper contact layer 302 to connect the first lower contact layer 301 and the first back contact layer 302. Accordingly, the channel layer 20 may be arranged in a structure in which the channel layer 20 is inserted into the first contact unit 300.

As an example, the first contact unit 300 may include an electrically conductive material. For example, the first contact unit 300 may include a metal or a metal compound. According to some example embodiments, the source electrode 30, the first conductive plug 31, and the first contact part 300 may be integrally formed. In this case, the source electrode 30, the first conductive plug 31, and the first contact part 300 may be collectively referred to as a source electrode.

The second contact unit 350 is arranged between the channel layer 20 and the second conductive plug 41, and may contact the channel layer 20 on three or more surfaces, for example, on four surfaces. As an example, when the channel layer 20 is provided in a thin film shape extending along one plane, the second contact unit 350 may include a second lower contact layer 351 surrounding a portion of the lower surface 21 of the channel layer 20, a second upper contact layer 352 surrounding a portion of the upper surface 22 of the channel layer 20, a second front contact layer 354 surrounding a portion of the front surface 25 of the channel layer 20, and a second rear contact layer 355 surrounding the rear side 26 of the channel layer 20.

The second lower contact layer 351 may be arranged to face the substrate 10. The second upper contact layer 352 may be arranged to face the second lower contact layer 351 with the channel layer 20 therebetween. As an example, the second upper contact layer 352 may be provided to contact one end of the second conductive plug 41. The second front contact layer 354 and the second rear contact layer 355 are arranged between the second lower contact layer 351 and the second upper contact layer 352 to connect the second lower contact layer 351 and the second upper contact layer 352. Accordingly, the channel layer 20 may be arranged in a structure in which the channel layer 20 is inserted into the second contact unit 350.

As an example, the second contact unit 350 may include an electrically conductive material. For example, the second contact unit 350 may include a metal or a metal compound. According to some example embodiments, the drain electrode 40, the second conductive plug 41, and the second contact part 350 may be integrally formed. In this case, the drain electrode 40, the second conductive plug 41, and the second contact part 350 may be collectively referred to as a drain electrode.

Figure 5:
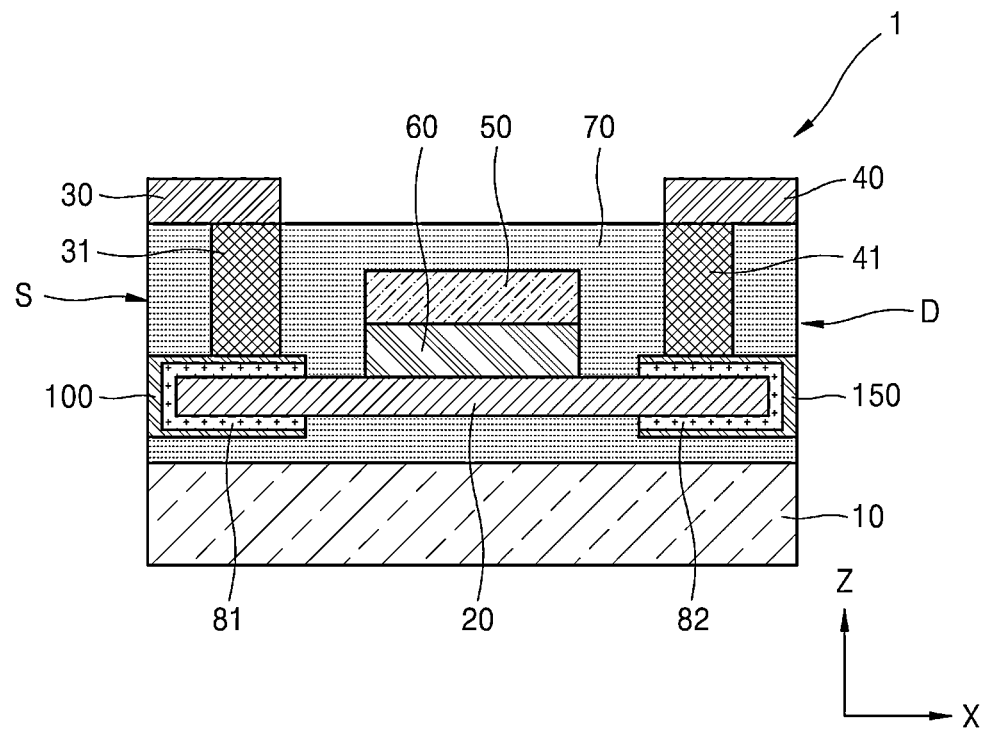
FIG. 5 is a cross-sectional view of an oxide semiconductor transistor according to some example embodiments.

FIG. 5 is a cross-sectional view of an oxide semiconductor transistor 1 according to some example embodiments.

Referring to FIG. 5, the oxide semiconductor transistor 1 according to some example embodiments may include: a substrate 10; a channel layer 20; a source electrode 30; a drain electrode 40; a gate electrode 50; a source region S including a first contact unit 100 electrically connected to the source electrode 30 and in contact with the channel layer 20 and a first conductive plug 31 in contact with the first contact unit 100 and extending in one direction; a drain region D including a second contact unit 150 electrically connected to the drain electrode 40 and in contact with the channel layer 20 and a second conductive plug 41 in contact with the second contact unit 150 and extending in one direction; an interlayer insulating layer 70; a first buffer layer 81; and a second buffer layer 82. Configurations other than the first buffer layer 81 and the second buffer layer 82 are substantially the same as those shown in FIGS. 1 and 2A, and thus, descriptions thereof will be omitted for convenience of explanation.

The first buffer layer 81 may be arranged between the channel layer 20 and the source region S, for example, the first contact unit 100. The second buffer layer 82 may be arranged between the channel layer 20 and the drain region D, for example, the second contact unit 150. As an example, the first buffer layer 81 and the second buffer layer 82 may contact the channel layer 20 on three or more surfaces. For example, the first buffer layer 81 is a layer provided for ohmic contact between the first conductive plug 31 and the channel layer 20, and may be in direct contact with the first conductive plug 31 and the channel layer 20. The second buffer layer 82 is a layer provided for ohmic contact between the second conductive plug 41 and the channel layer 20, and may be in direct contact with the second conductive plug 41 and the channel layer 20.

As an example, the first buffer layer 81 and the second buffer layer 82 may include a conductive material layer. For example, the first buffer layer 81 and the second buffer layer 82 may include one of a conductive oxide, an oxide including at least one of In, Ga and Zn, and an oxide including at least one of a two-dimensional (2D) material, W, and TiN. As an example, the conductive oxide may include ITO. As an example, the two-dimensional material may include graphene, TMD, BP, or h-BN.

Figure 6:
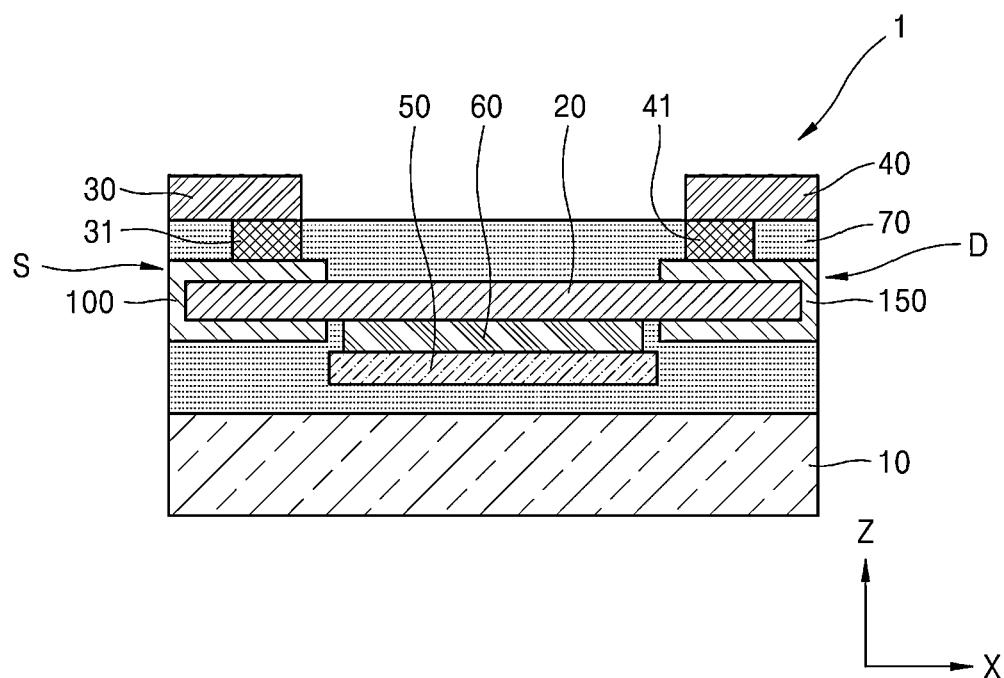
FIG. 6 is a cross-sectional view of an oxide semiconductor transistor according to some example embodiments.
Figure 7:
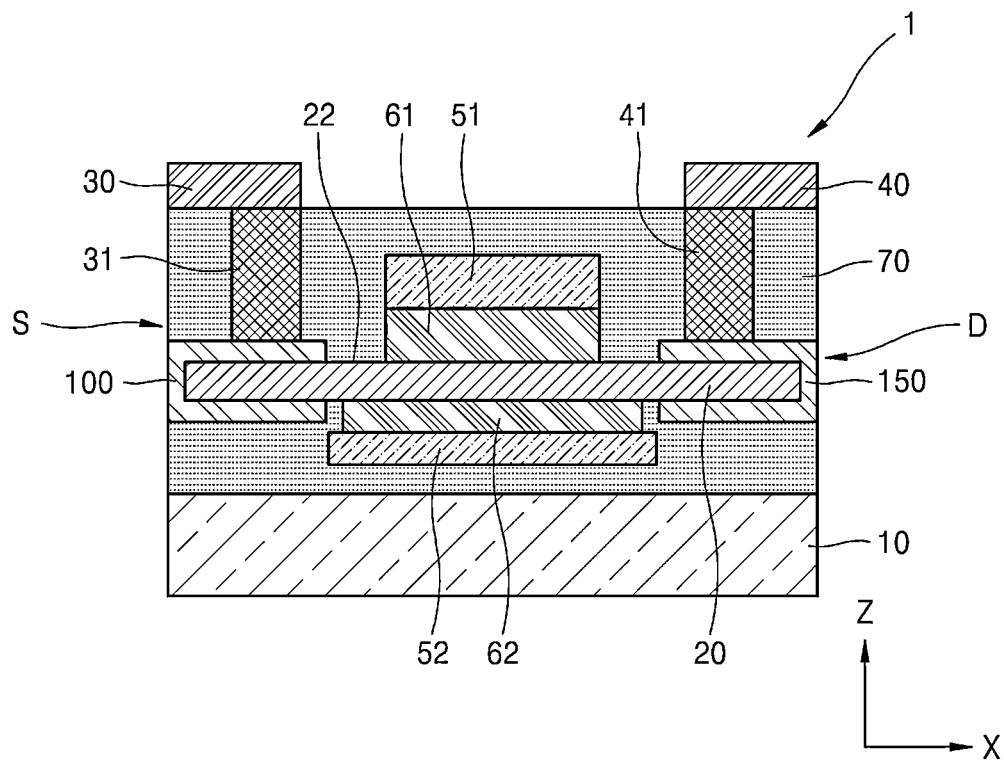
FIG. 7 is a cross-sectional view of an oxide semiconductor transistor according to some example embodiments.
Figure 8:
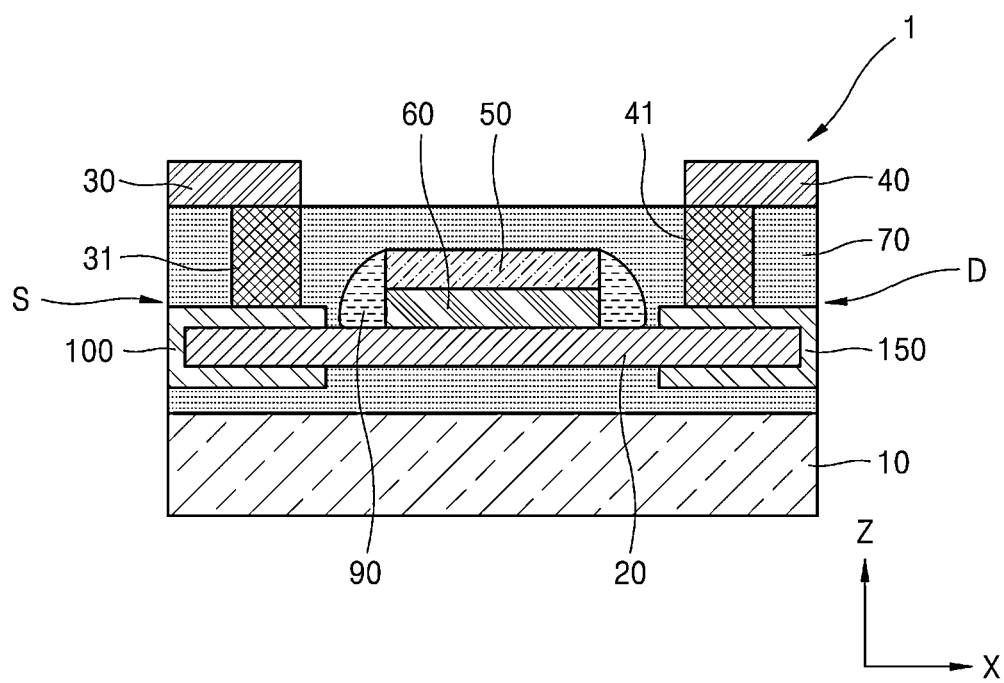
FIG. 8 is a cross-sectional view of an oxide semiconductor transistor according to some example embodiments.

FIG. 6 is a cross-sectional view of an oxide semiconductor transistor 1 according to some example embodiments. FIG. 7 is a cross-sectional view of an oxide semiconductor transistor 1 according to some example embodiments. FIG. 8 is a cross-sectional view of an oxide semiconductor transistor 1 according to some example embodiments.

Referring to FIGS. 6 to 8, the oxide semiconductor transistor 1 according to some example embodiments may include: a substrate 10; a channel layer 20; a source electrode 30; a drain electrode 40; a source region S including a first contact unit 100 electrically connected to the source electrode 30 and in contact with the channel layer 20 and a first conductive plug 31 in contact with the first contact unit 100 and extending in one direction; a drain region D including a second contact unit 150 electrically connected to the drain electrode 40 and a second conductive plug 41 in contact with the second contact unit 150 and extending in one direction; and an interlayer insulating layer 70. Configurations other than the gate electrode 50 are substantially the same as those shown in FIGS. 1 and 2A, and thus, descriptions thereof will be omitted for convenience of explanation.

Referring to FIG. 6, the gate electrode 50 according to some example embodiments may be arranged between the substrate 10 and the channel layer 20. In this case, the gate insulating layer 60 may be arranged between the gate electrode 50 and the channel layer 20. As a result, the gate stack 50+60 shown in FIG. 2A and the gate stack 50+60 shown in FIG. 6 are vertically symmetrical with respect to the channel layer 20. When the oxide semiconductor transistor 1 illustrated in FIG. 2A is expressed as a top gate transistor, the oxide semiconductor transistor 1 illustrated in FIG. 6 may be expressed as a bottom gate transistor.

Referring to FIG. 7, a first gate electrode 51 according to some example embodiments may be arranged on the upper surface 22 of the channel layer 20. In this case, a first gate insulating layer 61 may be arranged between the first gate electrode 51 and the channel layer 20. A second gate electrode 52 may be arranged between the substrate 10 and the channel layer 20. In this case, the second gate insulating layer 62 may be arranged between the second gate electrode 52 and the channel layer 20. As a result, the first gate stack 51+61 and the second gate stack 52+62 may be vertically symmetrical arranged with respect to the channel layer 20. When the oxide semiconductor transistor 1 illustrated in FIG. 2A is expressed as a top gate transistor, the oxide semiconductor transistor 1 illustrated in FIG. 7 may be expressed as a double gate transistor.

Referring to FIG. 8, a gate spacer 90 may cover side surfaces of the gate stack 50+60. The gate spacer 90 is formed on the upper surface 22 of the channel layer 20, and may cover both side surfaces of the gate electrode 50 and the gate insulating layer 60. The gate spacer 90 may be positioned between the first and second conductive plugs 31 and 41 and the gate stack 50+60 and separated from the first and second conductive plugs 31 and 41. As an example, a width of the gate spacer 90 in a direction parallel to the channel layer 20 may be formed to be narrower as it goes away from the channel layer 20, but the present disclosure is not limited thereto.

Figure 9:
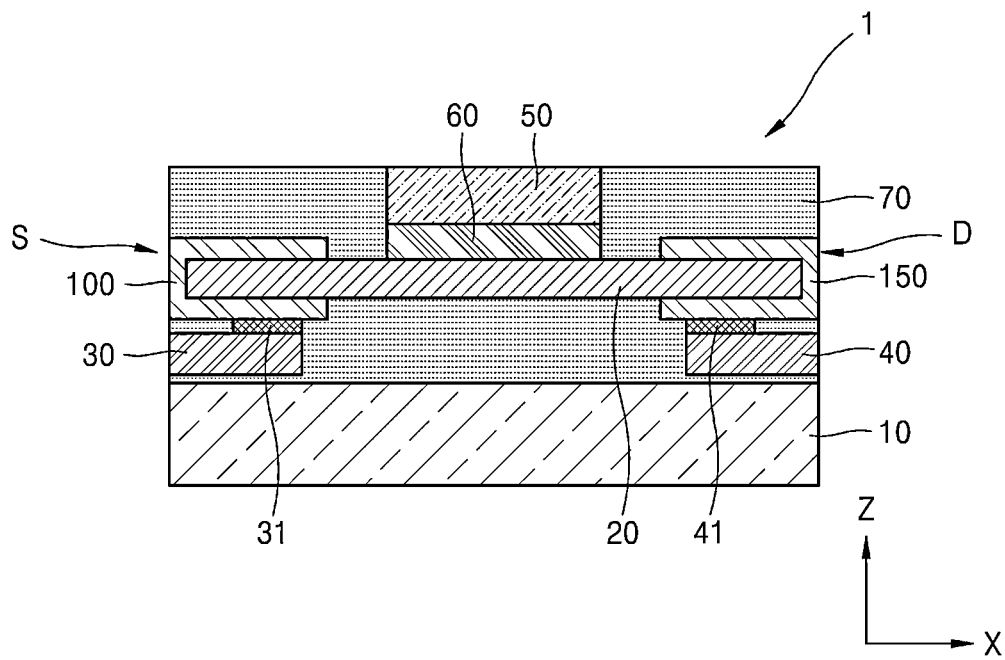
FIG. 9 is a cross-sectional view of an oxide semiconductor transistor according to some example embodiments.
Figure 10:
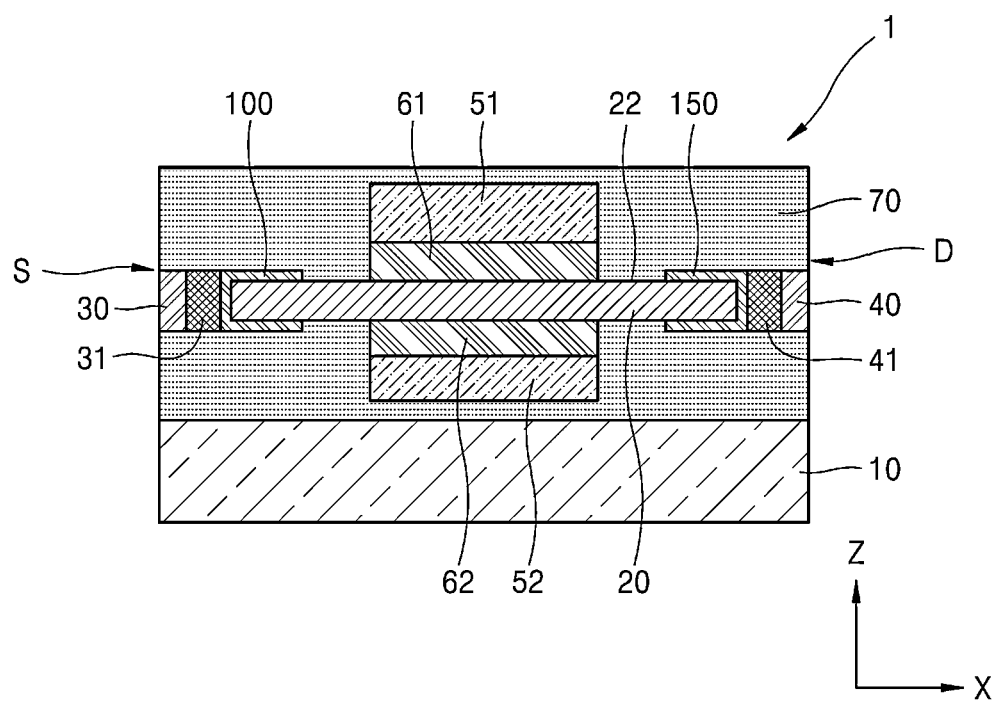
FIG. 10 is a cross-sectional view of an oxide semiconductor transistor according to some example embodiments.
Figure 11:
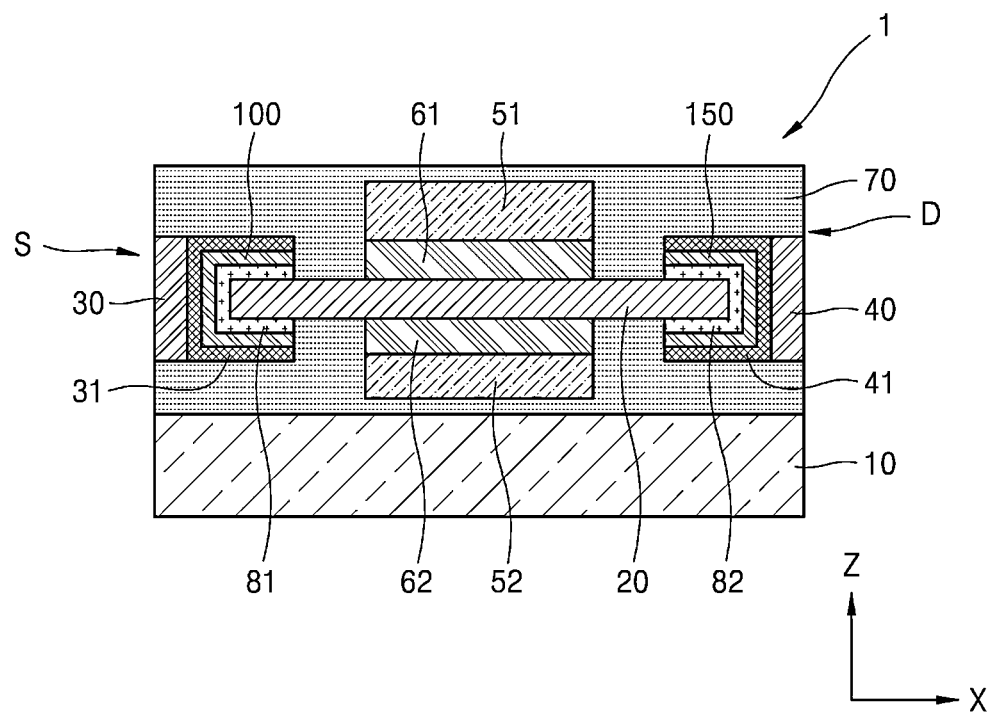
FIG. 11 is a cross-sectional view of an oxide semiconductor transistor according to some example embodiments.
Figure 12:
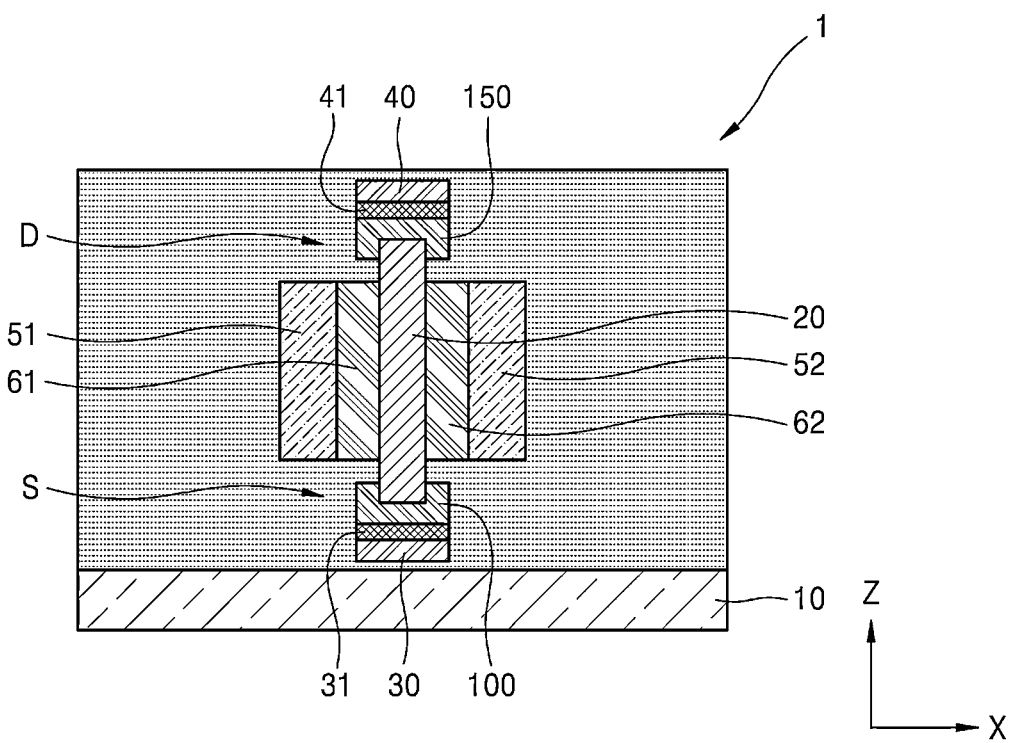
FIG. 12 is a cross-sectional view of an oxide semiconductor transistor according to some example embodiments.

FIG. 9 is a cross-sectional view of an oxide semiconductor transistor 1 according to some example embodiments. FIG. 10 is a cross-sectional view of an oxide semiconductor transistor 1 according to some example embodiments. FIG. 11 is a cross-sectional view of an oxide semiconductor transistor 1 according to some example embodiments. FIG. 12 is a cross-sectional view of an oxide semiconductor transistor 1 according to some example embodiments.

Referring to FIGS. 9 to 12, the oxide semiconductor transistor 1 according to some example embodiments may include a substrate 10, a channel layer 20, a source electrode 30, a drain electrode 40, a gate electrode 50, a source region S including a first contact unit 100 electrically connected to the source electrode 30 and in contact with the channel layer 20, a drain region D including a second contact portion 150 electrically connected to the drain electrode 40 and in contact with the channel layer 20, and an interlayer insulating layer 70. Configurations other than a first conductive plug 31 that is in contact with the first contact unit 100 and extends in one direction and a second conductive plug 41 that is in contact with the second contact unit 150 and extends in one direction are substantially the same as those shown in FIGS. 1 and 2A, and thus, descriptions thereof will be omitted for convenience of explanation.

Referring to FIG. 9, the first conductive plug 31 and the second conductive plug 41 according to some example embodiments may be arranged between the substrate 10 and the channel layer 20. In this case, the source electrode 30 may be arranged to contact one end of the first conductive plug 31. In this case, the source electrode 30 may be arranged to be buried by the interlayer insulating layer 70. In addition, the drain electrode 40 may be arranged to contact one end of the second conductive plug 41. In this case, the drain electrode 40 may be arranged to be buried by the interlayer insulating layer 70.

Referring to FIG. 10, the first conductive plug 31 and the second conductive plug 41 according to some example embodiments may extend in one direction parallel to an extending direction of the channel layer 20. In this case, the source electrode 30 may be arranged to contact one end of the first conductive plug 31. In this case, the source electrode 30 may be arranged to be buried by the interlayer insulating layer 70. Also, the drain electrode 40 may be arranged to contact one end of the second conductive plug 41. In this case, the drain electrode 40 may be arranged to be buried by the interlayer insulating layer 70.

As an example, the first gate electrode 51 may be arranged on an upper surface 22 of the channel layer 20. In this case, the first gate insulating layer 61 may be arranged between the first gate electrode 51 and the channel layer 20. The second gate electrode 52 may be arranged between the substrate 10 and the channel layer 20. In this case, a second gate insulating layer 62 may be arranged between the second gate electrode 52 and the channel layer 20. The gate electrode structure described above is substantially the same as the double gate transistor structure shown in FIG. 7. However, the present disclosure is not limited thereto, and the gate electrode structure may be implemented as a top gate transistor or a bottom gate transistor.

Referring back to FIG. 11, in the oxide semiconductor transistor 1 illustrated in FIG. 10, a first buffer layer 81 and a second buffer layer 82 may be additionally arranged. The first buffer layer 81 may be arranged between the channel layer 20 and the source region S, for example, the first contact unit 100. The second buffer layer 82 may be arranged between the channel layer 20 and the drain region D, for example, the second contact unit 150. As an example, the first buffer layer 81 and the second buffer layer 82 may contact the channel layer 20 on three or more surfaces. The first buffer layer 81 and the second buffer layer 82 may be substantially the same as the first buffer layer 81 and the second buffer layer 82 illustrated in FIG. 5.

Referring to FIG. 12, the channel layer 20 according to some example embodiments may extend in one direction Z perpendicular to an upper surface of the substrate 10. In this case, the first conductive plug 31 and the second conductive plug 41 may extend in one direction Z parallel to the extending direction of the channel layer 20. In addition, the source electrode 30 may be arranged to contact one end of the first conductive plug 31. In this case, the source electrode 30 may be arranged to be buried by the interlayer insulating layer 70. In addition, the drain electrode 40 may be arranged to contact one end of the second conductive plug 41. In this case, the drain electrode 40 may be arranged to be buried by the interlayer insulating layer 70.

As an example, the first gate electrode 51 may be arranged on the upper surface 22 of the channel layer 20. In this case, the first gate insulating layer 61 may be arranged between the first gate electrode 51 and the channel layer 20. The second gate electrode 52 may be arranged between the substrate 10 and the channel layer 20. In this case, the second gate insulating layer 62 may be arranged between the second gate electrode 52 and the channel layer 20. The gate electrode structure described above is substantially the same as the double gate transistor structure shown in FIG. 7. However, example embodiments are not limited thereto, and the gate electrode structure may be implemented as a top gate transistor, a bottom gate transistor, or a gate-all-around transistor in which the gate structure surrounds the channel layer, for example as a multi-bridge channel field effect transistor (MBCFET™).

Figure 13:
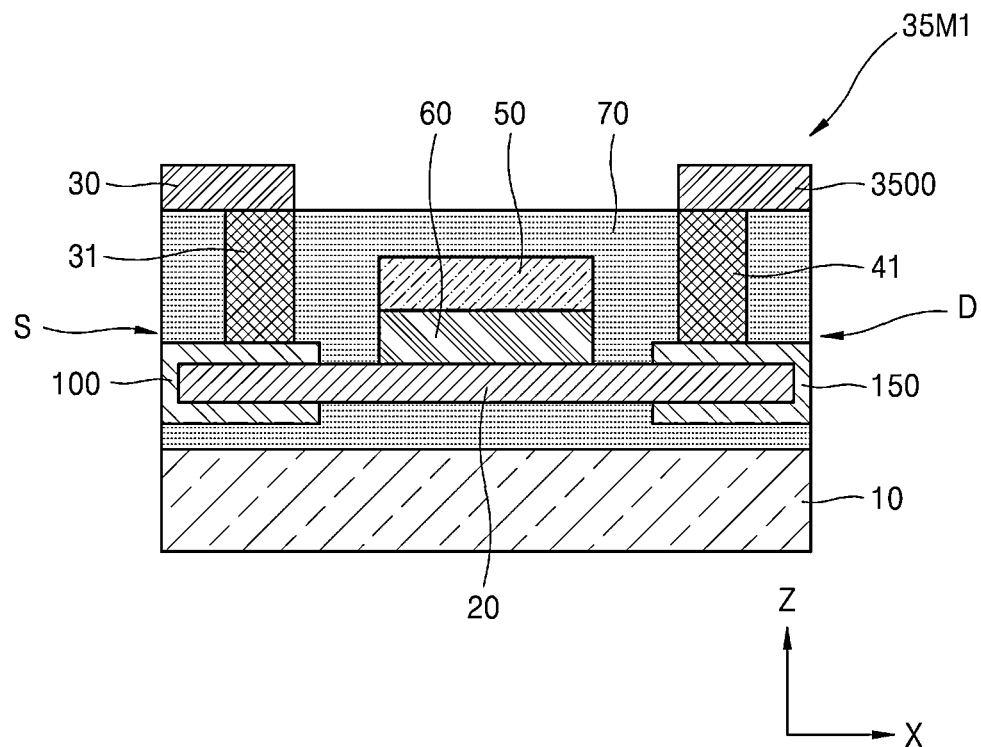
FIG. 13 illustrates a memory device including the transistor described above as a switching device and further including a data storage element connected to the switching device.

FIG. 13 shows a memory device 35M1 using the transistor described above as a switching device and including a data storage element 3500 connected to the switching device. In one example, the oxide semiconductor transistor 1 of FIG. 2A among the transistors described above is used as a switching device.

Referring to FIG. 13, the memory device 35M1 includes a data storage element 3500 on an interlayer insulating layer 70. The data storage element 3500 may cover an entire upper surface of the second conductive plug 41 and may be in contact with/direct contact with an upper surface of the second conductive plug 41. The data storage element 3500 may include at least one of a capacitor, a ferroelectric capacitor, or a magnetic tunnel junction (MTJ) cell. The memory device 35M1 may be a volatile memory device, such as DRAM, and/or may be a nonvolatile memory device, such as at least one of an FRAM, MRAM, ReRAM, or the like, according to the data storage element 3500.

Figure 14:
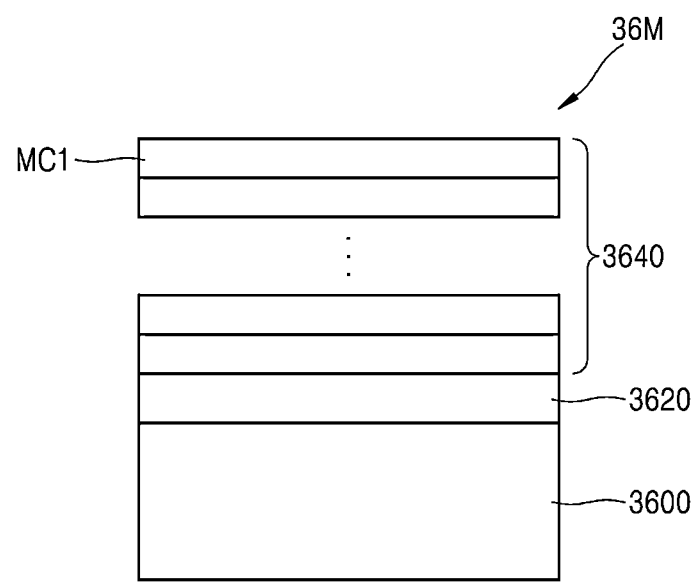
FIG. 14 illustrates a memory apparatus in which a plurality of memory devices of FIG. 13 are vertically stacked.

FIG. 14 shows a memory apparatus 36M in which a plurality of memory devices 35M1 of FIG. 13 are vertically stacked.

Referring to FIG. 14, a memory logic layer 3620 for controlling an operation of a memory apparatus 36M is arranged on a substrate 3600, and a memory cell array 3640 is provided on the memory logic layer 3620. The memory cell array 3640 includes a plurality of vertically stacked memory cells MC1. In one example, the memory cell MC1 may be the memory device 35M1 of FIG. 13.

Example embodiments may provide an oxide semiconductor transistor having improved electrical properties. For example, example embodiments provide an improved contact resistance for source contacts and/or drain contacts, by having contact units that at least partially wrap around a channel layer. Because a contact resistance is reduced, the transistors may operate at a higher speed and/or at a reduced power.

However, the effect of inventive concepts are not limited to the above disclosure.

It should be understood that embodiments described herein should be considered in a descriptive sense only and not for purposes of limitation. Descriptions of features or aspects within each embodiment should typically be considered as available for other similar features or aspects in other embodiments. Example embodiments are not necessarily mutually exclusive. For example, some example embodiments may include features described with reference to one or more figures, and may also include features described with reference to one or more other figures. While one or more example embodiments have been described with reference to the figures, it will be understood by those of ordinary skill in the art that various changes in form and details may be made therein without departing from the spirit and scope as defined by the following claims.

What is claimed is:

1. An oxide semiconductor transistor comprising:
a substrate;
a channel layer comprising oxide semiconductor material on the substrate;
a gate electrode facing a part of the channel layer; and
a source electrode and a drain electrode that are separated from each other with the gate electrode between the source electrode and the drain electrode; and
a contact unit arranged at least between the source electrode and channel layer or between the drain electrode and the channel layer,
wherein the contact unit includes an electrically conductive material and integrally and contiguously wraps around a first portion of the channel layer to contact at least three surfaces of the channel layer, wherein
the at least three surfaces include three or more of a top surface, a side surface, a bottom surface, the bottom surface opposite to the top surface, a front surface, and a rear surface, the rear surface opposite to the front surface,
wherein the contact unit contacts an upper surface of, a lower surface of, and one side surface of the channel layer.

2. An oxide semiconductor transistor comprising:
a substrate;
a channel layer comprising oxide semiconductor material on the substrate;
a gate electrode facing a part of the channel layer; and
a source electrode and a drain electrode that are separated from each other with the gate electrode between the source electrode and the drain electrode; and
a contact unit arranged at least between the source electrode and channel layer or between the drain electrode and the channel layer,
wherein the contact unit includes an electrically conductive material and integrally and contiguously wraps around a first portion of the channel layer to contact at least three surfaces of the channel layer, wherein
the at least three surfaces include three or more of a top surface, a side surface, a bottom surface, the bottom surface opposite to the top surface, a front surface, and a rear surface, the rear surface opposite to the front surface,
wherein the contact unit contacts an upper surface of, a lower surface of, the front surface of, and the rear surface of the channel layer.

3. The oxide semiconductor transistor of claim 1, further comprising:
a first buffer layer between the channel layer and the contact unit.

4. The oxide semiconductor transistor of claim 1, wherein the substrate includes an insulating substrate, and the contact unit contacts the substrate.

5. The oxide semiconductor transistor of claim 1, wherein the substrate includes a conductive substrate, and the contact unit is separated from the substrate.

6. The oxide semiconductor transistor of claim 5, further comprising:
an interlayer insulating layer between the substrate and a region including the contact unit.

7. The oxide semiconductor transistor of claim 1, wherein the gate electrode is on a second surface of the channel layer opposite to a first surface of the channel layer facing the substrate.

8. The oxide semiconductor transistor of claim 1, wherein the gate electrode is between the channel layer and the substrate.

9. The oxide semiconductor transistor of claim 1, wherein the gate electrode includes a first gate electrode, and the gate electrode further includes a second gate electrode symmetrically arranged with the first gate electrode with the channel layer therebetween.

10. The oxide semiconductor transistor of claim 1, further comprising:
a gate spacer covering a side surface of the gate electrode.

11. The oxide semiconductor transistor of claim 1, wherein the channel layer has a thickness of about 30 nm or less.

12. The oxide semiconductor transistor of claim 1, further comprising:
a gate insulating layer arranged between the channel layer and the gate electrode.

13. The oxide semiconductor transistor of claim 1, further comprising:
a first conductive plug contacting the contact unit and extending in one direction.

14. The oxide semiconductor transistor of claim 13,
wherein the first conductive plug extends in a direction perpendicular to a second surface of the channel layer that is opposite to a first surface of the channel layer facing the substrate.

15. The oxide semiconductor transistor of claim 13,
wherein the first conductive plug is between the channel layer and the substrate.

16. The oxide semiconductor transistor of claim 13,
wherein the first conductive plug extends in one direction parallel to the extending direction of the channel layer.

17. The oxide semiconductor transistor of claim 16,
wherein the gate electrode includes a first gate electrode, and the gate electrode further includes a second gate electrode symmetrically arranged with the first gate electrode with the channel layer between the first gate electrode and the second gate electrode.

18. The oxide semiconductor transistor of claim 13,
wherein the channel layer extends in one direction perpendicular to an upper surface of the substrate, and the first conductive plug extends in one direction parallel to the extending direction of the channel layer.

19. The oxide semiconductor transistor of claim 18,
wherein the gate electrode includes a first gate electrode, and the gate electrode further includes a second gate electrode symmetrically arranged with the first gate electrode with the channel layer therebetween.

20. A memory apparatus comprising a plurality of memory cells,
wherein each memory cell includes,
a switching device, and
a data storage element connected to the switching device, and
the switching device includes,
a channel layer comprising an oxide semiconductor material,
a gate electrode facing a part of the channel layer,
a source electrode and a drain electrode that are separated from each other with the gate electrode between the source electrode and the drain electrode, and
a contact unit arranged at least between the source electrode and channel layer or between the drain electrode and the channel layer,
wherein the contact unit includes an electrically conductive material and contiguous and integrally wraps around a first portion of the channel layer to contact at least three surfaces of the channel layer,
wherein the at least three surfaces include three or more of a top surface, a side surface, a bottom surface, the bottom surface opposite to the top surface a front surface, and a rear surface, the rear surface opposite to the front surface,
wherein the contact unit contacts an upper surface of, a lower surface of, and one side surface of the channel layer.

21. The oxide semiconductor transistor of claim 2,
wherein the contact unit further contacts the front surface of and the rear surface of the channel layer.

22. The memory apparatus of claim 20,
wherein the contact unit contacts a front surface of, and a rear surface of the channel layer.

23. The memory apparatus of claim 20,
wherein the contact unit further contacts a front surface of the channel layer.

* * * * *